Figure 1:
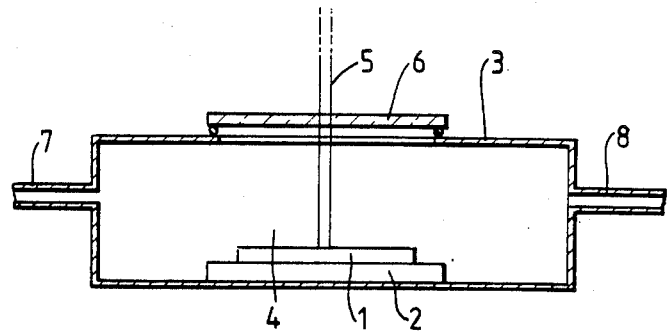

United States Patent [19]

Haigh et al.

[11] Patent Number: 4,705,593
[45] Date of Patent: Nov. 10, 1987

[54] ETCHING METHOD

[75] Inventors: John Haigh, Ipswich; Martin R. Aylett, Felixstowe, both of England

[73] Assignee: British Telecommunications, London, England

[21] Appl. No.: 881,182

[22] Filed: Jun. 26, 1986

[30] Foreign Application Priority Data

Jul. 4, 1985 [GB] United Kingdom ................ 8516984

[51] Int. Cl.$^4$ ....................... H01L 21/306; B44C 1/22; C03C 15/00; C03C 25/06
[52] U.S. Cl. ..................................... 156/635; 156/643; 156/646; 156/654; 156/662; 204/192.32; 219/121 LJ; 219/121 LM; 252/79.1
[58] Field of Search ............... 156/643, 646, 635, 654, 156/659.1, 662; 252/79.1; 204/192 EC, 192 E; 219/121 LJ, 121 LM, 121 FS; 204/192.32

[56] References Cited

U.S. PATENT DOCUMENTS 3,095,341 6/1963 Ligenza .
4,518,456 5/1985 Bjorkholm ...................... 252/79.2 X
4,624,736 11/1986 Gee et al. ............................. 156/643

FOREIGN PATENT DOCUMENTS 0124979 10/1978 Japan ..................................... 156/643

OTHER PUBLICATIONS

Brewer et al., "Laser-Assisted Dry Etching", 28 *Solid State Technology* No. 4, 273–78 (Apr. 1981).
Ashby, "Photochemical Dry Etching of GaAs", 45 *Applied Physics Letters* No. 8, 892–94 (Oct. 1984).
Chang, "Hydrogen Plasma Etching of GaAs and its Oxide", 81-2 *Extended Abstracts of the Journal of the Electrochemical Society* 648-49 (Oct. 1981).
Tu et al., "Surface Etching Kinetics of Hydrogen Plasma on InP", 41 *Applied Physics Letters* No. 1, 80–82 (Jul. 1982).
Ehrlich et al., "Laser-Induced Microscopic Etching of GaAs and InP," *Appl. Phys. Lett.* 36(8), Apr. 15, 1980, pp. 698–700.

*Primary Examiner*—William A. Powell
*Attorney, Agent, or Firm*—Nixon & Vanderhye

[57] ABSTRACT

Materials whose elemental constituents are selected from groups III and V of the Periodic Table are photochemically etched in a reducing environment. Etching is carried out by illuminating a halogenated hydrocarbon gas, e.g. methyl iodide, with ultra-violet light in the vicinity of the material. The reducing environment is provided by the presence of sufficient hydrogen to suppress the effect of any oxygen leaking into the system.

Methods according to the invention may be used in particular in the production of opto-electronic devices.

17 Claims, 2 Drawing Figures

ETCHING METHOD

The present invention relates to a method of etching and finds particular application in the field of opto-electronic device production.

Opto-electronic devices are becoming of increasing importance, particularly in communications as the use of optical communications becomes widespread. Methods that can be used in the production of opto-electronic devices are therefore also of increasing importance. Silica optical fibres, the basis of modern optical communication systems, as produced in recent years have loss minima at 1.3 μm and 1.55 μm approximately, the latter minimum being the deeper. Accordingly there is an especial need for opto-electronic devices operating in the range from 1.1 to 1.65 μm, especially from 1.3 to 1.6 μm. (These wavelengths, like all the wavelengths herein except where the context indicates otherwise, are in vacuo wavelengths.

Devices operating in this region of the infra-red, such as semiconductor lasers, usually comprise regions of materials containing at least one element selected from Group III and at least one element selected from Group V of the periodic table (III-V materials).

Examples of such materials include indium phosphide (InP), and the quaternary materials, the indium gallium arsenide phosphides ($In_xGa_{1-x}As_yP_{1-y}$). With regard to the latter, by suitable choices of x and y it is possible to lattice-match the various regions while varying the band gaps of the materials. (Band gaps can be determined experimentally by, for example, photoluminescence).

Further examples of III-V materials include gallium aluminium arsenide (GaAlAs) and gallium arsenide (GaAs). Devices comprising regions of these materials are also used for communications purposes. These devices operate near to 0.9 μm.

Additionally the III-V materials can be doped to be p-type or n-type as desired. It is convenient to use the term III-V semiconductor to refer to both doped and undoped material.

The production of opto-electronic devices generally involves the processing of the surface of a solid substrate, either by etching or by material deposition. A known method of processing a solid substrate is to illuminate a molecular gas in the close vicinity of the substrate. By combining a selected gas, either alone or with an inert diluent gas, with light including radiation of a particular wavelength or wavelengths, photodissociation of the gas can be caused. Depending on whether the active species so produced reacts with or is absorbed on the surface of the substrate, either etching or deposition can occur.

III-V materials can be etched using halogenated hydrocarbon gases illuminated at ultra-violet (u-v) wavelengths. In a paper by D J Ehrlich et al, "Laser Microphotochemistry for Use in Solid-State Electronics", *IEEE Journal of Quantum Electronics*, Vol QE - 16 (11) November 1980, methods of etching InP and GaAs are described.

It is considered in the above paper that etching of the substrate surfaces is caused by the chemisorption of photodissociated halide atoms onto the substrate surface, followed by formation and vaporisation of product salts. For instance, where the substrate is GaAs and the gas is $CH_3Br$, the chemisorption step is represented by the equation:

$$n(Br) \rightarrow n(Br):(GaAs)_{ads} + DE$$

where DE is the exothermicity released on absorption, the subsequently evaporated product salt being $GaBr_n$.

The following values are given in the above paper for laser induced etch rates of the materials indicated, using $CH_3Br$ as etchant at a pressure of 750 Torr, and using a continuous wave (CW) laser at 257.2 μm with a spot size of 19 μm (full width at half maximum; FWHM), at 100 $W/CM_2$:

| Substrate | Rate in nm/sec |
|---|---|
| n-doped GaAs oriented in a (100) plane | 0.52 |
| n-doped InP oriented in a (100) plane | 0.94 |

There are specific advantages in using photochemical etching in device production. Perhaps the greatest advantage is available where the light used is laser-produced. The photodissociation on which the process relies occurs only in the presence of light and a focussed or otherwise narrow laser beam can therefore be used to produce highly localised etching. This has the advantage that patterns can be etched by scanning of the laser beam rather than by the use of a mask. By eliminating the use of a mask, not only can device production be speeded up but also the risk of contamination is greatly reduced.

Even where flood exposure from a lamp or defocussed laser beam is used, with a mask to obtain a pattern, the method is highly controllable and can therefore offer reproducable and reliable results in device production. By selection of the gases used it should also be possible to etch materials selectively, enabling stop layers to be used for instance.

Also C. I. H. Ashby (in "Applied Physics Letters" No. 45(8) published on Oct. 15, 1984 by the American Institute of Physics) reports that GaAs exhibits greatly enhanced reactivity with gas-phase reactive Cl species when the surface is irradiated with low intensity laser light. The use of (gaseous) HCl in He to produce smooth Gaussian holes in irradiated GaAs is described.

Unfortunately the etch rate achieved by photochemical etching has been found to be significantly limited. This means that etching would generally only be practicable in certain circumstances, for instance where a limited depth of material is required to be etched.

Additionally it has been found that the etched surface produced by photochemical etching tends to be uneven rather than smooth as is desirable.

It is an object of the present invention to provide a method of etching which has enhanced efficiency.

According to the present invention there is provided a method of etching a surface, whose elemental constituents are selected from Groups III and V of the Periodic Table, which method comprises exposing the surface to free halide radicals in a reducing environment such as $H_2$ gas.

It has been found that methods according to the present invention do not suffer from the disadvantages mentioned above, the etch rate being comparatively fast and the etched surface produced being relatively smooth.

A particularly advantageous method of providing the free halide radicals is the illumination of a halide gas by light having a wavelength which allows it to be absorbed by the gas, so creating the free radicals. This method offers very good control of the etching process and, where the light is provided by a laser, very good localisation of the etching in relation to the surface.

The method of etching of this invention is particularly intended for use during the production of optoelectronic devices such as lasers for use in telecommunications. The production of these devices normally comprises growing the various regions by epitaxy processes. Some devices include a patterned interface, e.g. a distributed feedback laser includes a diffraction grating. It is common practice to produce the pattern by etching a surface while it is still exposed, i.e. by etching an incomplete device. After the etching the pattern may be covered by new layers grown thereon. In some cases, where the grating is exposed, the etching may be one of the final stages of the production.

Figure 2:
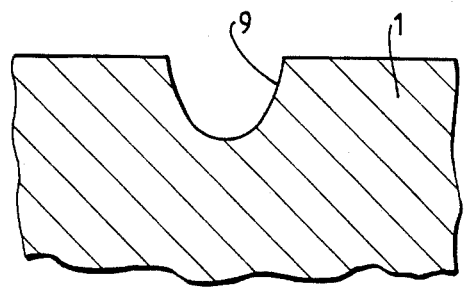

A method of etching an InP substrate according to an embodiment of the invention will now be described by way of example only, with reference to the accompanying drawings, of which:

FIG. 1 shows a cross-section of part of an arrangement for etching the substrate; and FIG. 2 shows a cross-section of a groove produced in the substrate by etching according to the method.

The figures are schematic only and are not drawn to scale.

Referring to FIG. 1, in order to etch the substrate 1 it is mounted on a support 2 in a cell 3. The cell 3 is provided with a u-v transparent window 6 and a laser (not shown) is mounted so that its beam 5 passes through the window 6 and impinges on the substrate 1. A gas mixture 4 flows through the cell 3, via an inlet 7 and an outlet 8, over the substrate 1.

The laser is an excimer laser operating on KrF at 248 $\mu$m. It is suitable for pulsed operation at a rate lof 100 pulses/sec each 10$\mu$ secs long. The radiation has an energy of $2.5 \times 10^{-8}$ Joules per pulse. The beam 5, which is partially focussed, irradiates an area of the substrate of $5 \times 10^{-8}$ cm$^2$, the power delivery being 50 watts/cm$^2$.

The material of the substrate 1 is undoped InP oriented in a (100) plane and the substrate 1 is in the form of a wafer of material 200 to 300 $\mu$m deep.

In carrying out the method of the invention, a mixture of methyl iodide and hydrogen is supplied to the cell 3 such that it flows over the substrate 1 at a rate lying in the range from 10 to 100 cm$^3$/min, inclusive. The partial pressure of methyl iodide in the mixture lies in the range from 1 to 100 Torr inclusive and the partial pressure of hydrogen in the mixture makes up the difference between that and atmospheric pressure, 760 Torr.

The spot of the laser beam 5 is scanned over the substrate 1 at a rate of 0.2 $\mu$m/sec in the presence of the gas mixture.

As a result of the above scanning, it has been observed that an etched groove is generated in the substrate 1, having a depth of about 1 $\mu$m and a width of 2 $\mu$m. The bulk rate of removal of the substrate material is therefore 0.4 $\mu$m$^3$/sec and the etch rate in terms of maximum groove depth is about 85 nm/sec. This compares well with that quoted by Ehrlich et al.

Referring to FIG. 2, the cross-section of the groove 9 produced has been found to be approximately Gaussian. This appears to reflect the intensity profile of the partially focussed laser beam. Varying the intensity profile of the beam would then vary the cross-section of the groove 9 produced.

The reactions which cause the etching to occur under the conditions described above are considered to be as follows:

(i) $CH_3I = CH_3 + I$ (ii) $InP + nI = InI_n + P$

That is, the methyl iodide dissociates under the action of the laser beam to generate iodine free radicals. The iodine free radicals in turn displace the phosphide ions from the substrate, the resulting indium iodide and the phosphorous species evaporating from the substrate surface.

The phosphorous species is shown as P, but it is probably present as $P_2$ or $P_4$. However, at the temperatures generated by the laser beam, $P_4$ is thought to be unlikely.

It is suggested, without in any way intending to limit the scope of the present invention, that the use of an oxygen-free reducing environment during the etching process prevents the generation of an involatile oxide film on the substrate caused by traces of $O_2$. The efficiency of the etching would then be increased by preserving the volatility of the reaction products.

It has been proposed to etch using an atmosphere of helium and halide gas. However, even a small amount of oxidising agent can exert an adverse effect and it is extremely difficult in practice to avoid ingress of oxidising agents, particularly oxygen. The presence of a reducing agent, e.g. hydrogen, controls the effect of such impurities.

The concentration of hydrogen in the gas mixture of the embodiment described above was selected to be sufficiently high to suppress the effect of any $O_2$ leaking into the system. Since the reaction of the $H_2$ with the $O_2$, which does not normally occur to any significant degree at room temperature, is promoted by the light source, the minimum concentration of hydrogen used should only need to be twice the equilibrium concentration of oxygen present during etching. With existing technology for making the system leakproof, the minimum pressure of hydrogen which should be used is then $10^{-2}$ Torr.

Although the use of a pulsed laser beam is described above, significantly improved etch rates be may be achieved by the use of a continuous wave operation laser. For instance a frequency doubled Ar ion laser operating continuously at 257 nm could be used.

There are alternative ways in which to produce a reducing environment. For instance the hydrogen might be replaced by carbon monoxide.

Methyl iodide is not the only gas with which etching can be carried out, other gaseous halides also being effective. For instance methyl bromide or ethylene dibromide could replace the methyl iodide in the method. However, methyl iodide is relatively convenient to use, being slightly less volatile than at least methyl bromide and therefore being less likely to have a toxic effect. Further, methyl iodide shows stronger u-v absorption than methyl bromide and therefore has a more efficient interaction with the light. (The etch rate quoted above may of course be altered by replacing methyl iodide with another gas).

Other III-V materials may be etched as well as indium phosphide. For instance, GaAs, GaAlAs, or the quaternary materials in $In_xGa_{1-x}As_yP_{1-y}$ might be etched by the method described.

Although the preferred method relies on the use of a laser, the light may be provided by a different source such as by a u-v lamp. Where this is the case, the concentration of hydrogen, or other component used to create a reducing environment, may have to be increased in order to be effective in suppressing the formation of oxide films. This is likely to be the case if the temperature produced during the process at the substrate surface is relatively low: an excess of hydrogen will be required in order to drive forwards the $H_2/O_2$ reaction.

Methods of etching according to embodiments of the present invention may be used in the production of a wide variety of opto-electronic devices including waveguide devices, detectors and lasers.

We claim:

1. A method of etching a surface, whose elemental constituents are selected from Groups III and V of the Periodic Table, which method comprises exposing the surface to free halide radicals in a reducing environment.

2. A method according to claim 1, wherein the free halide radicals are provided by the illumination of a halide gas by light having a wavelength which allows it to be absorbed by the gas.

3. A method of etching a pattern onto an exposed surface of a wholly or partly formed opto-electronic device, said surface being on a layer of III-V semiconductor, which method comprises exposing the surface to a reducing atmosphere which contains a halogen gas while illuminating the surface in the desired pattern with radiation adapted to dissociate said halogen gas into halogen radicals which react with the surface whereby the surface is etched with the pattern.

4. A method according to claim 3, wherein the illumination comprises traversing a spot of radiation over the surface in the desired pattern.

5. A method according to claim 4, wherein the light is provided by a laser.

6. A method according to claim 5, wherein a diffraction grating is etched on the exposed surface, which comprises traversing the spot in a series of parallel lines.

7. A method according to claim 3, wherein the reducing environment is provided by the presence of hydrogen.

8. A method according to claim 3, wherein the halide gas comprises a halogenated hydrocarbon.

9. A method according to claim 8, wherein the halide gas is a methyl halide.

10. A method according to claim 9, wherein the methyl halide is methyl iodide.

11. A method according to claim 3, in which the etched material is a compound of at least one element selected from In, Ga and Al with at least one element selected from P and As together with dopants.

12. A method of manufacturing an opto-electronic device which comprises a shaped interface wherein the shaped interface was etched by a method according to claim 3.

13. A method of manufacturing a distributed feedback laser which laser includes a diffraction grating, wherein said method includes the step of forming said grating by a method according to claim 6.

14. A method of etching a surface on a layer of III-V semiconductor, which method comprises exposing the surface to an atmosphere of hydrogen and a halogenated hydrocarbon while illuminating the surface with radiation adapted to dissociate said halogenated hydrocarbon into halogen radicals which react and etch the surface.

15. A method according to claim 8, wherein the halogenated hydrocarbon is a methyl halide.

16. A method according to claim 15, wherein the methyl halide is methyl iodide.

17. A method according to claim 16, in which the etched material is a compound of at least one element selected from In, Ga and Al with at least one element selected from P and As together with dopants.

* * * * *